United States Patent [19]

Johnson

[11] Patent Number: 4,630,355

[45] Date of Patent: Dec. 23, 1986

[54] ELECTRIC CIRCUITS HAVING REPAIRABLE CIRCUIT LINES AND METHOD OF MAKING THE SAME

[75] Inventor: Robert R. Johnson, Franklin, Mich.

[73] Assignee: Energy Conversion Devices, Inc., Troy, Mich.

[21] Appl. No.: 709,876

[22] Filed: Mar. 8, 1985

[51] Int. Cl.[4] ...................... H01L 21/66; H01L 21/42
[52] U.S. Cl. ......................................... 29/575; 29/574; 29/576 T; 29/591; 148/DIG. 55; 357/45
[58] Field of Search ............. 29/571, 574, 575, 576 R, 29/576 T, 578, 589, 590, 591; 148/1.5, DIG. 55; 357/65, 45, 17; 350/330, 350 R, 342, 340, 335, 334

[56] References Cited

U.S. PATENT DOCUMENTS

| | | | |
|---|---|---|---|
| 3,271,591 | 9/1966 | Ovshinsky | 29/610 |
| 4,100,486 | 7/1978 | Casowitz et al. | 29/574 X |
| 4,217,374 | 8/1980 | Ovshinski et al. | 148/1.5 X |
| 4,226,898 | 10/1980 | Ovshinski et al. | 148/1.5 X |
| 4,295,182 | 10/1981 | Aubusson et al. | 29/574 X |
| 4,339,285 | 7/1982 | Pankove | 29/571 |
| 4,368,523 | 1/1983 | Kawate | 29/575 X |
| 4,451,970 | 6/1984 | Izu et al. | 29/574 |
| 4,545,111 | 10/1985 | Johnson | 29/574 |

*Primary Examiner*—Brian E. Hearn
*Assistant Examiner*—David A. Hey
*Attorney, Agent, or Firm*—Lawrence G. Norris; Robert S. Nolan

[57] ABSTRACT

Circuit assemblies are disclosed which include a supporting substrate, a plurality of conductive lines supported on the substrate and a deposited phase-change material capable of an energy induced phase change from an initially high resistance state to a relatively low resistance state placed in electrical contact with the conductive lines. The assemblies also include contact receiving means connected to the conductive lines at preselected discrete locations to receive externally applied contact means, such as electric probes, for applying voltages across selected portions of the conductive lines. The application of such voltages can induce a phase change in portions of the phase-change material which bridge breaks in the conductive lines of such circuit subassemblies, changing such portions from their high resistance state to their low resistance state, thereby forming electrically shunting conductive paths around such open circuits. There are also disclosed methods of making such circuit assemblies.

20 Claims, 18 Drawing Figures

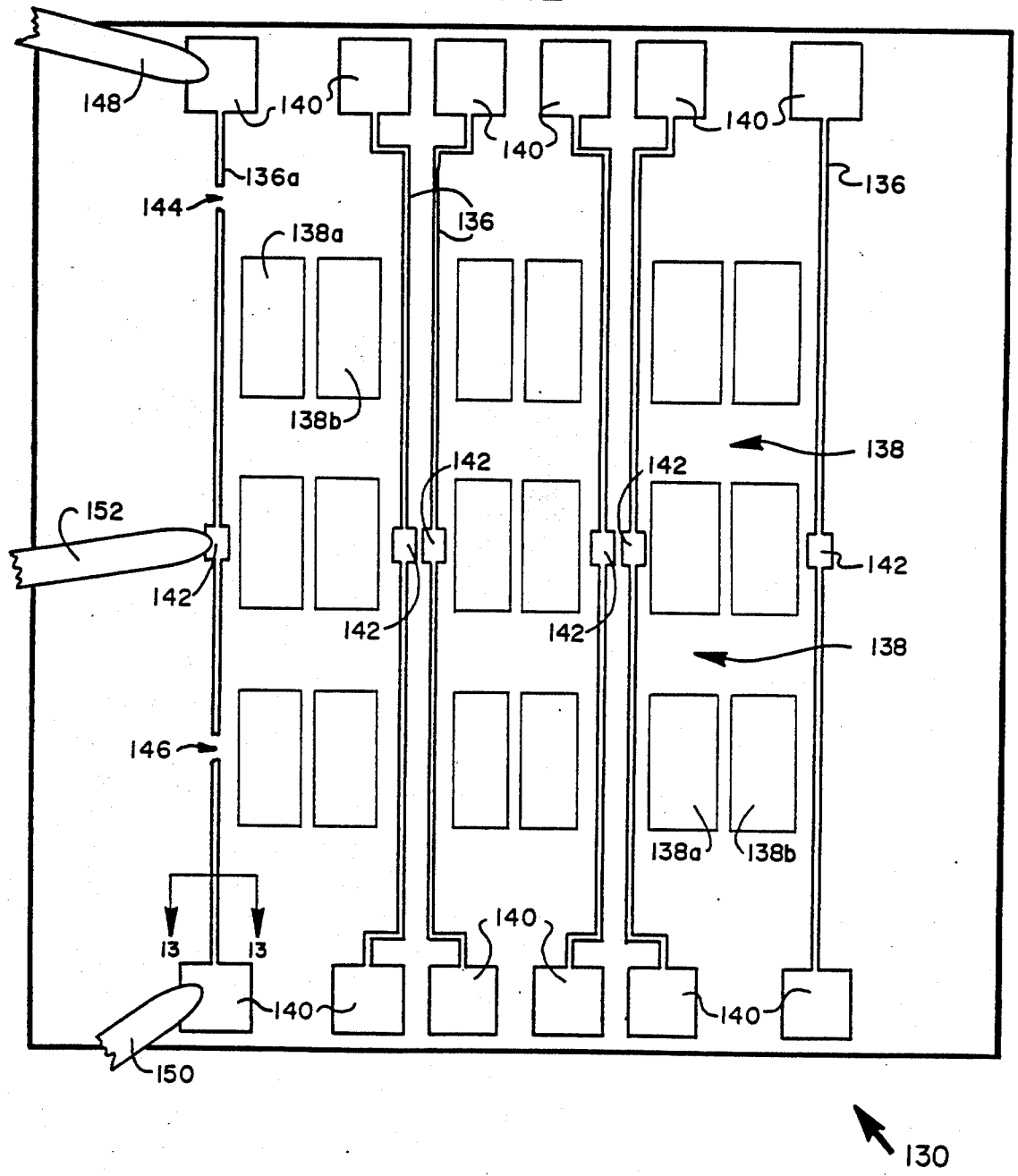
FIG. 12
FIG. 13
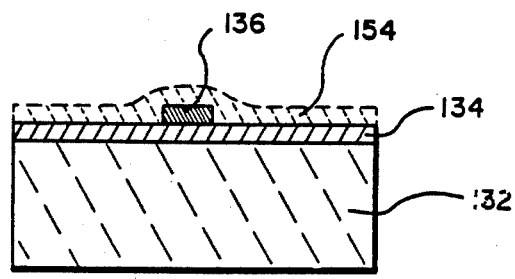

ELECTRIC CIRCUITS HAVING REPAIRABLE CIRCUIT LINES AND METHOD OF MAKING THE SAME

FIELD OF THE INVENTION

The present invention relates to electric circuits and circuit elements, such as integrated circuits and interconnection wiring substrates, and to methods for making such circuits and circuit elements. The present invention more particularly relates to such circuits and circuit elements in which small breaks or discontinuities which occur in conductive lines can easily be repaired.

BACKGROUND OF THE INVENTION

In recent decades, great advances have been made in the art of fabricating integrated circuits. Such advances have made it possible to pack a great number of circuit elements and connecting circuit lines into a small space. For example, it is possible to fabricate integrated circuits with several hundred thousand active circuit elements in less than a square centimeter. Advances have also begun to make it possible to fabricate integrated circuits over much larger areas by the use of such techniques as wafer scale integration and large area integration using amorphous semiconductor materials. Large area integration using amorphous semiconductor materials is of particular interest because it enables an integrated circuit to be created over an area much larger than that of currently available crystalline substrates. Amorphous semiconductors circuit elements can be created without crystalline substrates and without the high temperature required for the formation of crystalline semiconductor devices. As a result, amorphous semiconductor devices can be created on a wide range of substrates, such as glass plates or continuous rolls of stainless steel. Take for example, U.S. patent application Ser. Nos. 458,919 filed on Jan. 18, 1983 and 558,216 filed on Dec. 5, 1983 both entitled "Electronic Matrix Arrays and Method for Making the Same" both of which were filed by the inventor of the present application and assigned to the assignee of the present application, and both of which are incorporated herein by reference. Both of these patent applications show electronic matrix arrays in which a plurality of first spaced apart address lines and a plurality of second spaced apart address lines cross to form a plurality of intersections. Material extending between the first and second sets of address lines create circuit elements between the intersecting address lines. Integrated circuits of the type disclosed in these two applications are well suited for large area fabrication. Similarly, U.S. patent application Ser. No. 573,004 filed on Jan. 23, 1984 by Zvi Yaniv, Vin Cannella, Greg Hansell and Lou Swartz and entitled "Liquid Crystal Displays Operated by Amorphous Silicon Alloy Diodes," which has been assigned to the assignee of the present application, and which is incorporated herein by reference, discloses, among other things, a liquid crystal display formed of two opposing plates, each of which can be made as a single integrated circuit fabricated by deposition and photolithography. The plates of such a display are well suited for large area fabrication, and can be made large enough for use as normally sized computer or television screens.

Sometimes the conductive lines which connect the elements of an integrated circuit to each other or to the contact pads through which such elements communicate with the external world contain unintended breaks, or discontinuities, in which the resistance is unacceptably high. Such breaks cause electrical open circuits or high resistance sections in what are intended to be electrically conductive current paths. Such open circuits can be formed either when a circuit is fabricated or after its fabrication is complete. Line breaks formed during the fabrication of a circuit normally results from failures in the photolithographic processes used to make the circuit. Post fabrication line breaks can be caused by such factors as vibration, thermal expansion and contraction, and metal migration, which is the flow of metals caused by high current densities. As the number of conductive lines packed into a given area of an integrated circuit increases, and as the area of such circuits is increased, the chance for conductive line breaks grows, making the problems of such line breaks an important factor to contend with.

The problem of line breaks is particularly important in the fabrication of liquid crystal displays. It is desirable to manufacture such displays in a large area, such as approximately one foot square, so they can be used to replace computer and television screens. If there is a break in an address line used in such a display, all of the display pixels disconnected by the break become inoperative. The failure of an individual pixel is often acceptable, but the failure of all the pixels in a part of a row or column normally makes a display unmarketable.

A major prior art method for dealing with electrical breaks in the conductive lines of integrated circuits is to produce such integrated circuits in large numbers, to test them, and then to throw away those circuits which malfunction. More advanced techniques have been developed which use the technique of redundancy. For example, U.S. Pat. No. 4,228,528, issued on Oct. 14, 1980 to Cenker et al and entitled "Memory With Redundant Rows and Columns" discloses a memory device in which there are fuses placed between decoder circuits and the row or column memory lines associated with each of those decoders. If a given memory line is found to be defective, its fuse is blown, disconnecting it from its decoder. Then a spare, programmable decoder connected to a spare memory line is programmed to respond to the bit pattern of the disconnected decoder. Although redundancy techniques such as those disclosed in the Cenker et al. patent are very useful in many applications, they result in the disconnection of circuit elements which could be used if such circuit breaks could be repaired. In addition, such redundancy techniques are often not satisfactory when used in displays, since it is not satisfactory to replace a given row or column of a display with a row or column located at a different place. Furthermore, in circuits, such as microprocessors, in which the layout is much less uniform than in memory circuits, the use of redundancy techniques is quite complex.

Problems with breaks and discontinuities in conductive lines are not limited to integrated circuits. They can arise in many kinds of electrical circuitry. For example, interconnect substrates upon which integrated circuits or integrated circuit packages are mounted, such as printed circuit boards, ceramic interconnect substrates and polyimide interconnect systems, usually contain many circuit lines. A failure in any of one of these lines can cause the whole circuit in which such an interconnect substrate is used to malfunction. As the complexity and circuit density of integrated circuits has increased, so has the complexity and density of interconnect substrates and the likelihood of breaks and discontinuities in the circuit lines of such substrates. Thus there is a strong need for a way to heal such breaks or discontinuities once they occur.

SUMMARY OF THE INVENTION

The invention of the present application relates to electric circuits and electric circuit subassemblies in which electrical breaks in circuit lines can be repaired by the application of energy.

According to one aspect of the invention, a circuit assembly is provided which includes a supporting substrate and a plurality of conductive lines supported on the substrate and adapted to interconnect circuit elements supported or to be supported on the substrate. A deposited phase-change material is provided which is capable of electrically induced phase change from an initially relatively disordered, relatively high resistance state to a more disordered, more crystalline, relatively low resistance state. The deposited phase-change material is placed so as to be in electrical contact with at least portions of the conductive lines, so as to form an electrically parallel path between selected portions of such lines. The assembly also includes contact receiving means positioned on the conductive lines and adapted to receive at preselected discrete locations thereon, exteriorly applied contact means, such as electrical probes, for applying voltages between selected portions of the conductive lines which might be broken by inadvertent openings or discontinuities. This permits the electrical inducement of a phase change in the phase-change material from its initially high resistance state to its low resistance state at breaks whenever they occur along the conductor. The phase-changed material forms an electrically shunting conductive path around the open circuit in the conductive line, completing the conductive path of the line, and, in effect, repairing the electrical break.

In certain embodiments, the phase-change material includes an alloy of silicon. In others, the phase-change material is formed of a chalcogenide material or alloy. In certain embodiments, the phase-change material is deposited on top of the conducting line which it is intended to repair. In others, the conductive lines are deposited on top of the phase-change material.

In some embodiments of the invention, the circuit assembly described above is incorporated in a liquid crystal display and the repairable conductive lines are adapted to connect circuit elements associated with the individual pixels of such a display. In other embodiments, the circuit assembly is designed for use in an electronic matrix array of the type having a plurality of first spaced apart address lines, a plurality of second spaced apart address lines forming a plurality of cross over points with the first address lines, and selection means between each of the cross over points for establishing selectable current paths through respective pairs of the first and second address lines. In such an embodiment, the repairable conductive lines can be address lines of such an electronic matrix array. In many embodiments the circuit assembly is an integrated circuit which is at least partially complete. In other embodiments, such a circuit assembly is used to form an interconnect substrate for supporting and interconnecting integrated circuits.

In another embodiment, the invention is incorporated into a packaged integraged circuit. The packaged integrated circuit includes an integrated circuit having a supporting substrate and a plurality of conductive lines supported on the substrate. The lines are adapted to interconnect circuit elements supported on the substrate. The integrated circuit further includes a deposited phase-change material capable of electrically induced phase change from an initially high resistance, relatively insulating state to a relatively low resistance, conductive state. The deposited phase-change material is placed so as to be in electrical contact with portions of the conductive lines, so as to form electrically parallel paths between selected portions of the conductive lines. The packaged integrated circuit includes packaging means for enclosing its integrated circuit. It also includes connection means which are electrically connected to the conductive lines of its integrated circuit and which extend from the integrated circuit, through the packaging means to form portions external to the packaging means. The connection means are for receiving voltages applied to their respective external portions and for applying those voltages between selected portions of the conductive lines. This permits the electrical inducement of a phase change in a selected portion of the phase-change material, so as to form an electrically shunting conductive path around an open circuit in a conductive line in the packaged integrated circuit.

According to other aspects of the inventions, methods are provided for producing the electric circuit assemblies of the type described above.

BRIEF DESCRIPTION OF THE DRAWINGS

In the drawings, which form an integral part of the specification and are to be read in conjunctin therewith, and in which like reference numerals are employed to designate similar components in various views;

FIG. 12 is a top plan view of an integrated subassembly designed for use in a liquid crystal display with electric probes connected to its contact receiving means;

FIG. 13 is a cross-sectional side view of a portion of the subassembly shown in FIG. 12 taken along the line 13—13 of that Figure;

DETAILED DESCRIPTION OF THE PREFERRED EMBODIMENT

Figure 1:
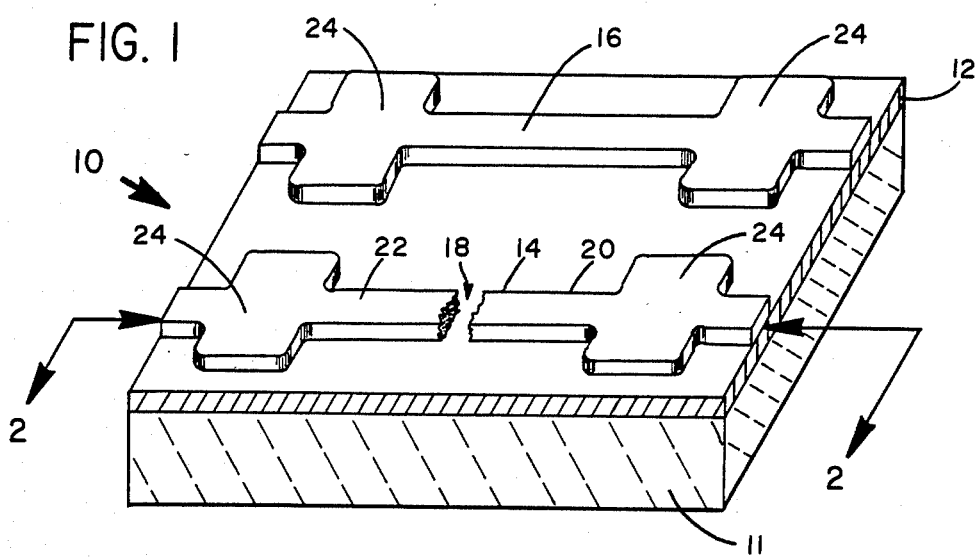
FIG. 1 is a perspective view of a portion of an integrated circuit subassembly embodying the present invention.

Referring now to FIG. 1, a portion 10 of an integrated circuit subassembly is shown which embodies the present invention. The subassembly is formed on a supporting substrate 11 made, for example, of glass. A layer 12 of phase-change material is deposited on top of the substrate 11. The term "phase-change material" refers to the class of materials capable of phase change between a relatively disordered, high resistance state and a more ordered, more crystalline, low resistance state. Examples of such material are set forth in U.S. Pat. No. 3,271,591 issued to Stanford R. Ovshinsky on Sept. 6, 1966, assigned to the assignee of the present application, which is incorporated herein by reference, as well as in many other patents assigned to the assignee of the present application. For example, the phase-change material can be made of a tetrahedral material or an amorphous alloy containing at least one of the elements, silicon, germanium or carbon. The phase-change material can also be made of an amorphous alloy of such tetrahedral material which contains hydrogen or fluorine. Such tetrahedral materials or alloys can be deposited by techniques similar to those described in U.S. Pat. No. 4,217,374 issued to Stanford R. Ovshinsky and Masatsugu Izu entitled "Amorphous Semiconductors Equivalent to Crystalline Semiconductors" and U.S. Pat. No. 4,226,898 issued to Stanford R. Ovshinsky and Arun Madan of the same title, both of which are incorporated herein by reference. The term phase-change material also includes materials including elements selected from the group of chalcogenides, including tellurium and selenium alloys, such as, for example, $Ge_{70}Te_{30}$ or $Ge_{45}Te_{45}Se_{10}$. For the purposes of the present invention, a thickness of about 1,000 angstroms is adequate for the layer 12.

Conductive circuit lines 14 and 16 are formed on top of layer 12 by photolithographic techniques. As is shown in FIG. 1, the circuit line 14 has an electrical break, or open circuit, 18 which prevents proper electrical conduction between its two parts 20 and 22, which are separated by that break. The circuit lines 14 and 16 are formed of a conductive material, preferably such as a metal or a conductive oxide, such as indium tin oxide.

As stated above, the structure shown in FIG. 1 is a portion of an integrated circuit assembly which is still in the process of manufacture. It is advantageous to repair breaks in circuit lines before an integrated circuit is completely fabricated, because once a conductive line has been covered with subsequently deposited layers it may be more difficult to reach and repair. For this reason, each of the circuit lines 14 and 16 shown in FIG. 1 is provided with contact receiving means 24 positioned on those lines and adapted to receive externally applied contact means, such as the electric probes 26 and 28 shown in FIG. 2.

The contact receiving means are fabricated at preselected, discrete locations relative to the integrated circuit for access by automatic testing and repairing apparatus which places electric probes, such as the probes 26 and 28, upon those contact receiving means during testing and repair operations. In FIG. 1, the contact receiving means are probe pads. In that figure the probe pads 24 are shown very close to each other relative to the width of the conductive lines on which they are located. It should be understood that the shape and scale of the circuit lines shown in FIG. 1 has been exaggerated for purposes of representation. In actual embodiments of the invention, the probe pads connected to a given conductive line would normally be spaced apart from each other by a very large multiple of the widths of their associated circuit lines.

Figure 2:
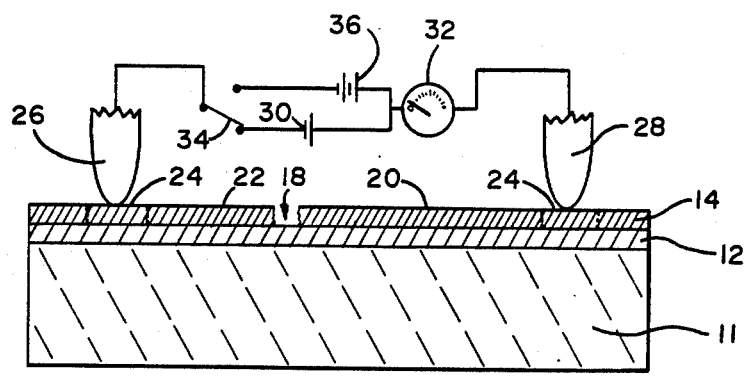
FIG. 2 is a cross sectional side view of the subassembly shown in FIG. 1 taken along the line 2—2, which, in addition, shows in schematic form circuit means set for testing the continuity of a circuit line.
Figure 3:
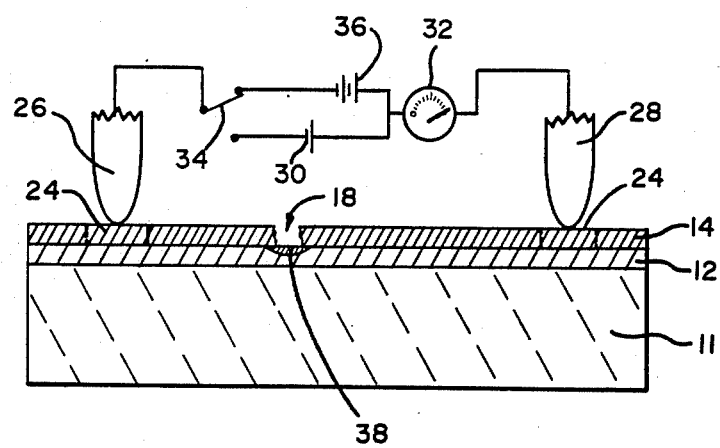
FIG. 3 is identical to FIG. 2 except that it shows the circuitry of FIG. 2 set for changing the phase of phase-change material which bridges an open circuit in a circuit line and it shows that phase-change material after it has undergone such a phase change.

After the integrated circuit subassembly 10 has reached the point shown in FIG. 1, electric probes such as those shown in FIG. 2 are lowered to make contact at the preselected locations in which its probe pads 24 are positioned. At this point, an electrical continuity test is performed to determine if the portion of the circuit line 14 between the probes 26 and 28 forms a complete current path. This is done by connecting a relatively low voltage source 30 and a current measuring device 32 in series between the probes 26 and 28 by means of a switch 34. If very little current flows between the two probes, the indication is that a circuit break exists between them. If this is the case, a voltage source 36 capable of applying a sufficient voltage and current to alter the phase of the phase-change material which bridges the gap 18 is connected between the two probes 26 and 28 by switch 34. When the voltage source 36 is connected across the probes 26 and 28, a portion 38 of the phase-change material which bridges the gap 18 is fused, that is, it has its phase changed to a relatively more crystalline, low resistance state, as shown in FIG. 3. Once this occurs, the current meter 32 registers a large increase in current flow, indicating conducting line 14 has had its conductive path repaired. At this time the switch 34 is disconnected and the probes 26 and 28 are removed.

The amount of voltage and current required to heal a line break varies as a function of the phase-change material used and the length of gap to be bridged. For example, experiments indicate that a break of approximately one micron length bridged by a phase-change alloy of silicon and either hydrogen or fluorine requires the application of approximately 100 volts to be healed. The amount of voltage required tends to increase linearly with the length of the circuit gap for breaks from a tenth of a micron to several microns in length. The phase change is typically accomplished by passing between 10 microamps and 10 milliamps through the material for between 1 microsecond and 1 millisecond. The larger the current flow, the greater the volume of phase-change material changed to the more conductive state, and the lower the resistance of the healed circuit line.

After line 14 and the other conducting lines formed in the same layer have had their circuit breaks healed, additional layers are deposited on top of those lines and their respective probe pads, since no further contact to such probe pads is required. In alternate embodiments of the invention, where the testing and healing of the conducting lines formed on a given layer is not performed until after additional layers have been deposited over such lines, probe pads connected to such lines are left uncovered so that electrical probes can still access them for testing and repair after such additional layers have been deposited.

Figure 4:
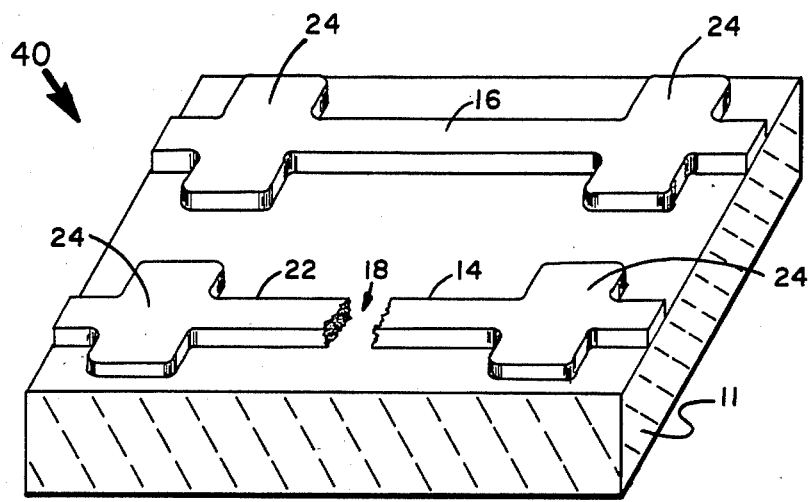
FIG. 4 is a perspective view of a portion of an integrated circuit subassembly similar to that shown in FIG. 1 except that no phase-change layer is present, and the conductive lines have been deposited directly upon the substrate.
Figure 5:
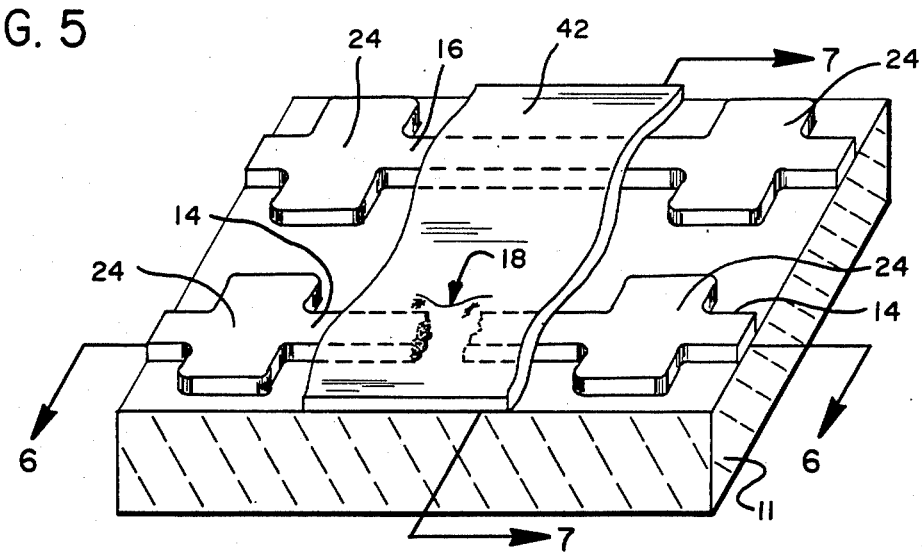
FIG. 5 shows the subassembly of FIG. 4 with the addition of a layer of phase-change material placed over a portion of its conductive lines.
Figure 6:
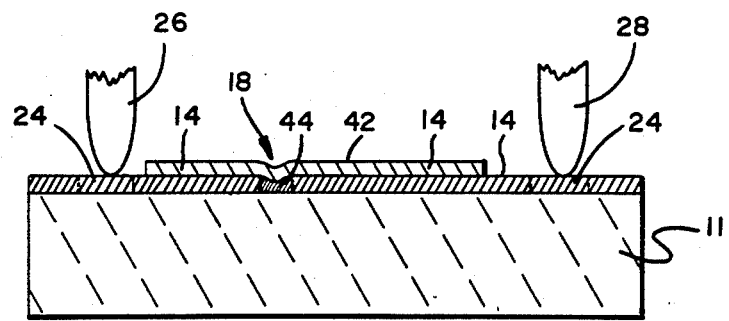
FIG. 6 is a cross sectional side view of the subassembly shown in FIG. 5 taken along the lines 6—6 in that Figure and showing, in addition, electric probes connected to the contact receiving means shown in FIGS. 4 and 5.

Referring now to FIGS. 4 through 6, a portion of an integrated circuit subassembly 40 according to another embodiment of the present invention is shown. This embodiment of the invention, is similar to that in FIG. 1, except that the conductive lines 14 and 16 are deposited directly upon the substrate 11 rather than upon a layer 12 of phase-change material, as shown in FIG. 1. In FIG. 5, after lines 14 and 16 have been formed, a layer 42 of phase-change material, similar to the layer 12 shown in FIG. 1, is deposited on top of them. However, the phase-change material of layer 42 is not deposited over the probe pads 24. This is to make those pads available for contact by electric probes as shown in FIG. 6, which is a cross section of FIG. 5 taken along the line 6—6. Like the subassembly shown in FIG. 1, the subassembly shown in FIG. 5 is ready to have any breaks, such as the break 18 in line 14 repaired. This is done by connecting electrical probes 26 and 28 to the probe pads 24 of each line to be tested and repaired. By means similar to those discussed in regard to FIGS. 2 and 3 above, the probes 26 and 28 are used to test the electrical continuity of line 14. If the probes detect that the current path between them is not complete, a voltage source of sufficient power is connected between the probes to induce a phase change and fuse a portion 44 of the phase-change material of layer 42 which bridges the gap 18.

Figure 7:
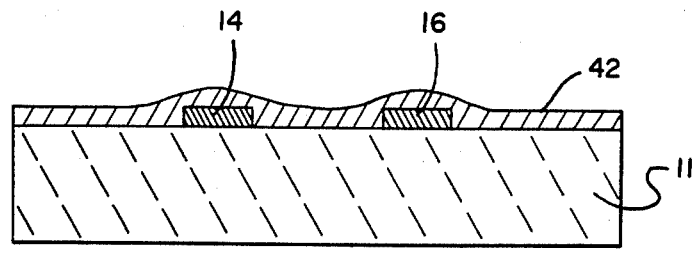
FIG. 7 is a cross sectional side view showing the subassembly of FIG. 5 taken along the lines 7—7 in that Figure.

Referring now to FIG. 7, there is shown a cross sectional side view of the subassembly in FIG. 5, taken along the line 7—7. Once the circuit lines 14 and 16 have been tested and, when appropriate, repaired by the methods described above, the subassembly is used to complete an electronic matrix array of a type similar to that discussed in the above identified U.S. patent application Ser. No. 558,216, which is hereby incorporated by reference. When the subassembly is used for this purpose, the layer 42 of phase-change material should be formed of an N-doped amorphous semiconductor material such as that described in the above mentioned application Ser. No. 558,216.

Figure 8:
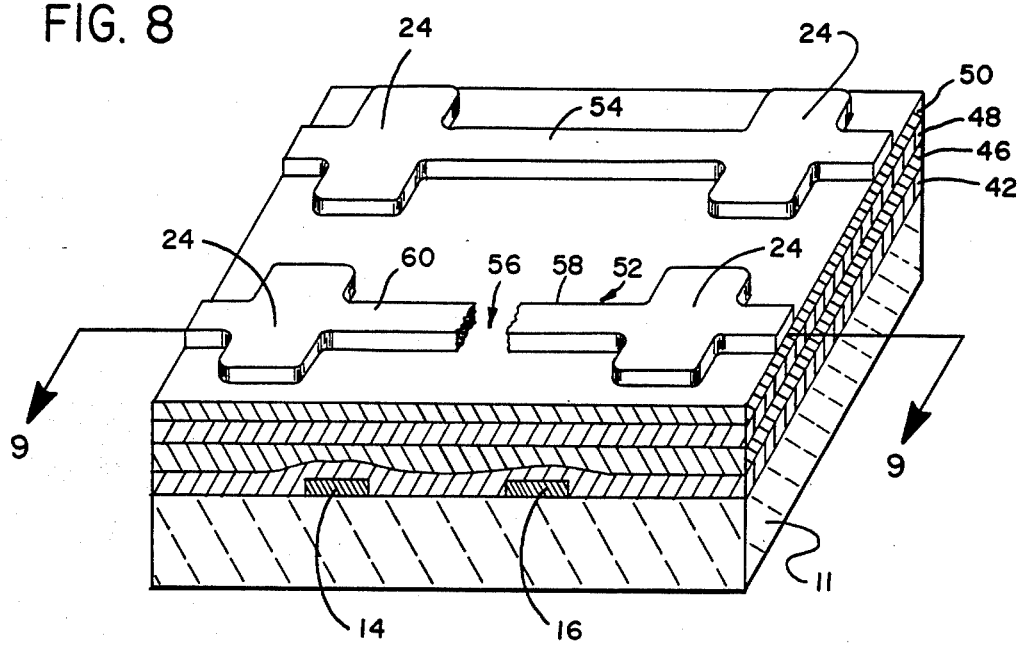
FIG. 8 is a perspective view of a subassembly of an electronic matrix array formed by adding additional circuit layers to the subassembly of FIG. 7.
Figure 9:
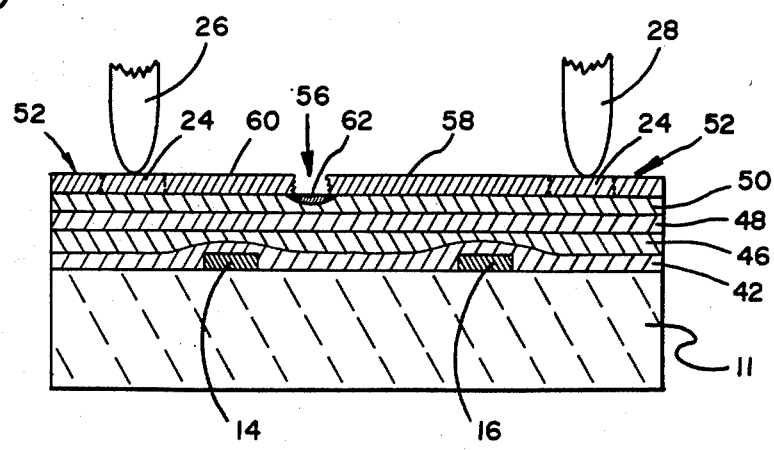
FIG. 9 is a cross-sectional side view of the subassembly shown in FIG. 8 taken along the line 9—9 of that Figure with the addition of electric probes touching the contact receiving means shown in FIG. 8.

As is shown in FIGS. 8 and 9, a layer of relatively intrinsic amorphous semiconductor material 46 is deposited on top of the N-type layer 42, followed by a layer of P-type amorphous semiconductor material 48 deposited on top of that. The three layers 42, 46 and 48 form a P-I-N diode layer which enables electric current to be conducted in a direction down from the layer 48 toward the conductive lines 14 and 16, but which tends to prevent conduction of current in the opposite direction. On top of the layer 48 a layer 50 of memory material is deposited. Such material can be either of an amorphous semiconductor material optimized for its settable, but substantially nonresettable, qualities, so as to form a permanent memory material, or a material, such as a chalcogenide material which is both settable and resettable, so as to form a reversable memory material. Both types of amorphous semiconductor materials are described in greater detail in the above mentioned application Ser. No. 558,216, and both types can be used as phase-change materials for purposes of the present invention.

Above the layer 50, conductive lines 52 and 54 are formed by photolithographic techniques. As is described in greater detail in the above mentioned application Ser. No. 558,216, the layers 42, 46, 48 and 50 place a diode and a memory cell between each circuit line of a first set of circuit lines lying directly on the substrate 11, such as the lines 14 and 16, and each circuit line in a second set of circuit lines deposited on the layer 50, such as the lines 52 and 54. By the application of a programming voltage and current between two lines, such as lines 54 and 16, the memory material located between them is changed to a relatively more crystalline and more conductive state, thus storing a bit of information. If the layer 50 is made of a material which can have its phase both set and reset by the proper applications of voltages, as is described in the above mentioned application Ser. No. 558,216 or the above mentioned U.S. Pat. No. 3,217,591, the memory cell located between a line on the top of layer 50 and a line on top of the substrate 12 can be used to erasably store bits of information. The diode comprised of the layers 48, 46 and 42 function as selection means by causing current to flow only between a line lying above layer 50 supplied with a relatively positive potential and a line supported on substrate 11 supplied with a relatively negative potential.

It should be noted that when the layers 46, 48 and 50 are deposited they cover the probe pads 24 shown in FIG. 5. But since those probe pads are not covered with the layer 42, the portion of the diode layer formed over them is not as good a rectifier as, and thus does not function as well as a selection means as, the portion of the diode layer comprised of all three layers. Thus conductive address lines are not placed over the positions of layer 50 which lie over such probe pad.

It should also be noted that the circuit lines 14 and 16 are shown deposited directly on the substrate 11 in FIGS. 7-9. This is appropriate when, as in the embodiment shown, the substrate 11 is made of an insulator such as glass. However, in embodiments in which the substrate is made of a conductor, such as stainless steel, the substrate should first be coated with an insulating layer before the metal lines 14 and 16 are placed upon it to achieve the desired electrical isolation between those lines.

When, as is shown in FIG. 8, a circuit break 56 occurs in the circuit line 52, the portion of the line 52 cut off from operating voltages by the break is made useless, as are all of the intersections between that cutoff portion of the line 52 and the conductive lines lying on the opposite side of the layers 42, 46, 48 and 50. In order to prevent the loss of such a large number of circuit elements, it is desireable to be able to heal the break in the line 52. This is done by applying two electrical probes 26 and 28 to the probe pads 24. These probe pads comprise contact receiving means positioned on the conductive line 52. As is discussed above with regard to FIGS. 2, 3 and 4, a voltage source in series with a current measuring device is placed across the two probes 26 and 28 to determine if there is electrical continuity in the portion of the circuit line between them. When the test indicates an open circuit between the two probes, a voltage source is connected between them, in a manner similar to that shown in FIG. 3, which is capable of supplying sufficient voltage and current to fuse a portion 62 of the phase-change material in layer 50. Once the portion 62 of the phase-change material is fused, an electrically shunting conductive path is formed around the break 56, so as to effectively heal it.

Figure 10:
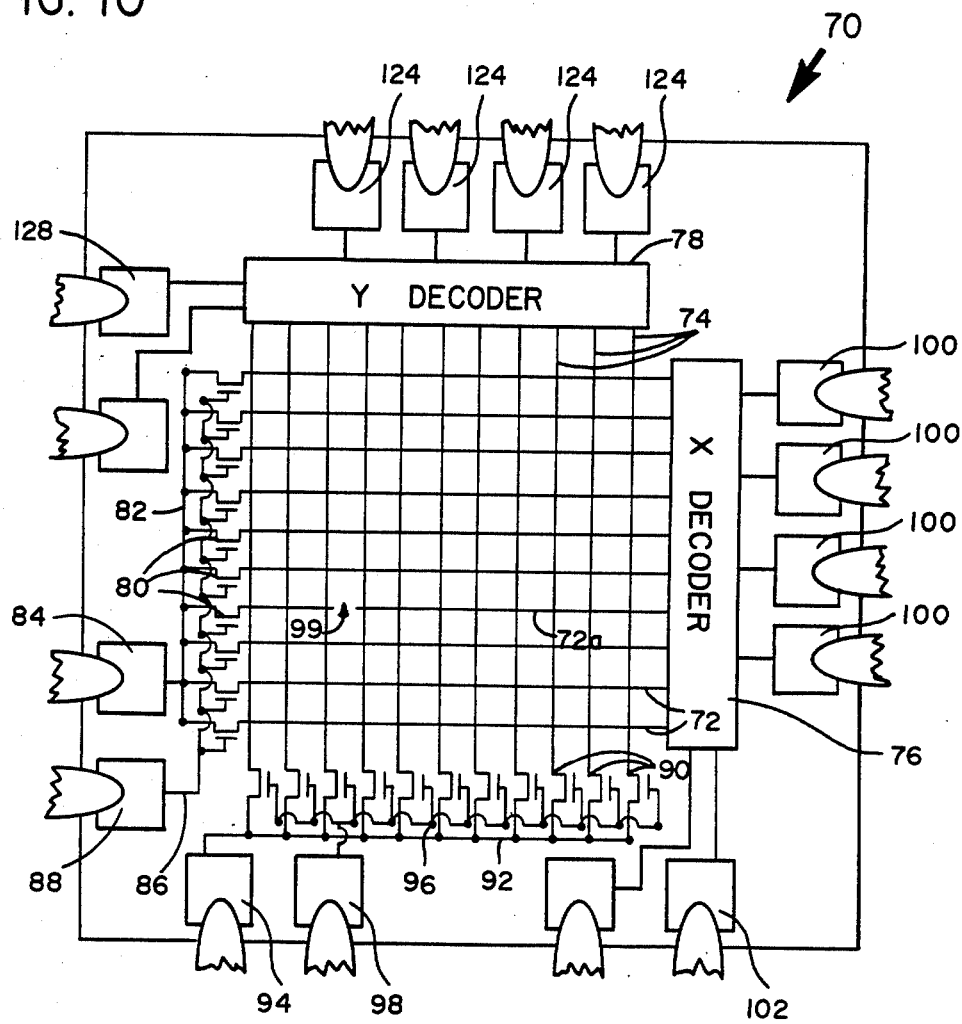
FIG. 10 is a top plan view of a complete integrated circuit having electric probes connected to its contact receiving means.

Referring now to FIG. 10, a completed integrated circuit 70 is shown in schematic form. The circuit 70 is a completed integrated circuit in the sense that all of its circuit elements, conducting lines and protective layers have been deposited. Circuit 70 is a memory chip comprised of a plurality of intersecting X lines 72 and Y lines 74. Both the X lines and Y lines are covered with a respective layer of phase-change material of the type described above, which is capable of being changed from a relatively non-conductive to a relatively conductive state. Each of the memory elements addressed by an intersection of an X line and a Y line are of the type discussed above with regard to FIGS. 8 and 9. Each of the X address lines is connected at a first end to receive an addressing voltage from the X decoder 76. Similarly each of the Y lines 74 is connected at a first end to receive an addressing voltage from the Y decoder 78. Each of the X address lines 72 is connected at its second end through an individual pass transistor 80 to a common line 82, connected to a contact pad 84. All of the gate electrodes of the pass transistors 80 are connected to a common line 86, which is connected to a contact pad 88. Similarly, each of the Y address lines 74 is connected at its second end through an individual pass transistor 90 to a common line 92, connected to a contact pad 94. All of the gate electrodes of the pass transistors 90 are connected in common to a line 96, connected to a contact pad 98.

With the arrangement shown in FIG. 10 it is possible to repair breaks which occur in address lines 72 and 74, even if such lines have been covered with subsequently deposited layers. After the fabrication of the integrated circuit 70 is complete, electrical probes are connected to its contact pads to test the circuit. When it is determined that a break has occurred in one of the circuit lines, such as the break 99 in circuit line 72a, the following steps are taken to heal the break. The probes connected to the contact pads 100 which form the address input of the X decoder 76 are supplied with an address which selects the line 72a. A probe is connected to a contact pad 102 for supplying a high voltage through the X decoder to one side of the break 99. At the same time, the probe connected through pad 84 and pass transistors 80 to the other side of break 99 is supplied with a low potential. Then a probe supplies sufficient voltage to contact pad 88 to turn on transistors 80. As a result, the voltage difference supplied between contact pads 102 and 84 is applied across break 99 and fuses the phase-change material which bridges that break.

The testing and line repairing techinque described immediately above, is most quickly performed under the control of an automatic testing machine programmed with diagnostic software to determine when a given X or Y line has a break and to repair that given line by the application of voltage as described above.

Although the integrated circuit described in FIG. 10 includes memory elements of the type described with regard to FIGS. 8 and 9 above, it should be clear to those skilled in the art that the present invention can be used with other types of memory elements. For example, the present invention can be used with memory elements comprised of transistors or of both transistors and capacitors. The transistors used can be made either of amorphous or crystalline semiconductor materials, as long as the conduction lines to be healed are in contact with phase-change material capable of electrically induced phase change, as described above.

Figure 11:
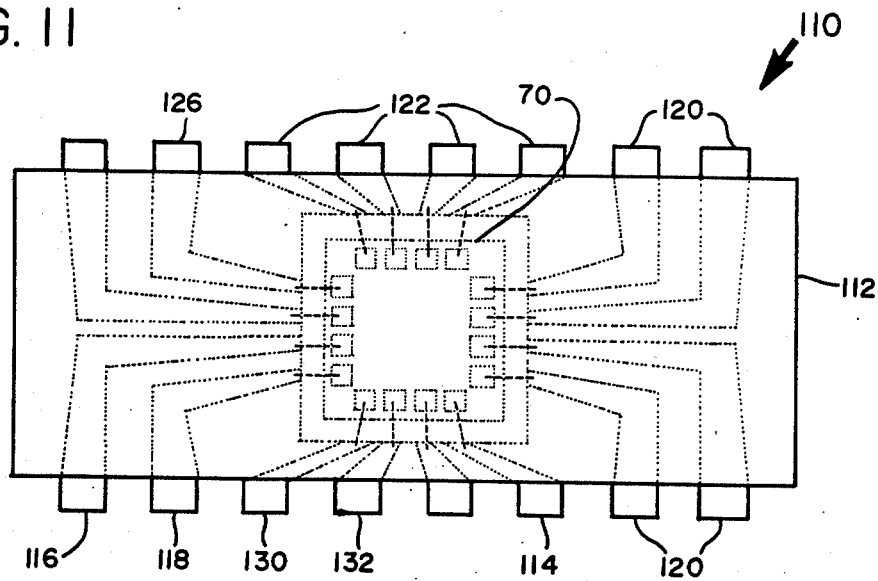
FIG. 11 shows a packaged integrated circuit in which the integrated circuit shown in FIG. 10 is enclosed in a packaging means.

Referring now to FIG. 11, a packaged integrated circuit 110 is shown which includes an integrated circuit 70 of the type shown in FIG. 10. The packaged integrated circuit 110 also includes a packaging means 112 for enclosing the integrated circuit 70. In the embodiment shown, the packaging means 112 is fabricated either from plastic or from a bonded ceramic material of a type commonly used in packaging integrated circuits. The packaged circuit also includes connection means electrically connected to conductive lines of circuit 70 through the contact pads of that circuit. These connection means include the connection means 114, 116, 118, 120, 122, 124, 126, 130 and 132. These connection means extend from the contact pads on the integrated circuit 70 through the packaging means 112 (as shown in dotted lines). They each have a portion external to the packaging means 112 (shown in solid lines), which form the pins of the dual-in-line package shown in FIG. 11. The connecting means 114 is connected to the X-line phase-change-inducing high voltage contact pad 102 of FIG. 10, the connection means 116 to the X-line phase-change-inducing low voltage contact pad 84, the connection means 118 to the gate electrode contact pad 88, the four connection means 120 to the four X decoder address contact pads 100, the connection means 122 to the four Y decoder contact pads 124, the connection means 126 to the Y-line phase-change-inducing high voltage contact pad 128, the connection means 130 to the Y-line phase-change-inducing low voltage contact pad 94, and the connection means 132 to the gate electrode contact pad 98. The connection means are connected through the above mentioned contact pads to be able to test and repair electrical breaks or open circuits in the X and Y address lines of the circuit 70, even after that circuit has been packaged. In fact, even after the circuit has been placed in operation, it can have the continuity of its address lines tested and breaks in such continuity repaired by placing the proper voltages and currents on its external pins.

For example, the electrical continuity of an X line 72 in circuit 70 is tested by (a) applying a voltage to the connection means 118, which turns on the pass transistors 80 through contact pad 84, by (b) applying a voltage between connection means 116 and 114, which applies one end of that voltage through contact pad 84 and pass transistors 80 to one end of all the lines, and which applies the other end of that voltage through contact pad 102 and decoder 76 to the other end of a selected X line, by (c) selectively addressing each of the X lines through the connection means 120 which control X decoder 76, and by (d) determining the amount of current which flows between connection means 114 and 116 when each individual X line is selected. By performing this operation, any breaks in the X address lines are detected. If there are any such breaks, a phase change inducing voltage is applied between the connection means 116 and 114 to repair them. Testing and repairing of the Y lines is performed in a similar manner.

Referring now to FIGS. 12 and 13, an integrated circuit subassembly 130 for use in a liquid crystal display is shown. A substrate 132, formed in this embodiment of a transparent material, such as glass, is provided. A layer 134 of phase-change material is deposited upon the substrate 132, as is shown in the cross sectional view of FIG. 13, taken along the line 13—13 in FIG. 12. A layer of a transparent conductive material such as indium tin oxide is laid down on top of the layer 134 and etched to provide a plurality of conductive current lines 136. Also patterned out of the indium tin oxide layer are a plurality of split pixels 138.

Each split pixel contains two separate electrode segments, an electrode segment 138a and an electrode segment 138b. These two segments are designed to operate in conjunction with a common electrode, not shown, to be located on an opposing substrate to control the optical state of liquid crystal material to be used with the given pixel. The operation of split pixels is explained in greater detail in U.S. patent application Ser. No. 626,133 entitled "Liquid Crystal Displays and Subassemblies Having Improved Pixel Electrodes," filed by Zvi Yaniv, Yair Bar-on, Vincent D. Cannella and Gregory Hansell, which is incorporated herein by reference. Each of the circuit lines 136 has connected at its opposite ends an enlarged portion 140 of indium tin oxide. The portions 140 are to be coated with metal during a later stage of the fabrication process and are to be used as external contact pads. Each of the conductive lines 136 also includes a probe pad 142 located between the contact pads 140. Such intermediate probe pads increase the chance that a circuit line 136 can be repaired if it has more than one circuit break within it. For example, the circuit line 136a in FIG. 12 has two open circuits occurring within it, a first break 144 and a second break 146. After the indium tin oxide layer is deposited and patterned, conductive probe pads can be connected to each of the contact pads 140 of a given circuit line 136. A test can be conducted in the manner discussed above to determine if there is proper electrical continuity along the line being tested. If not, a power source is applied to fuse the phase-change material bridging such an open circuit. However, if the application of voltage normally required to heal a short circuit break does not result in establishing electrical continuity, an additional electrical probe 152 can be connected to the intermediate probe pad 142. Then tests are conducted between the probe 152 and the probes 148 and 150 to determine if there is an electrical break in the portion of line 136 between each pair of probes. Once the electrical breaks 144 and 146 shown in FIG. 12 have been detected, they can be repaired by applying the proper voltage and current between the probe located on each side of them.

Thus it can be seen that it is often advantageous to have probe pads placed in portions of conductive circuit lines, which will later be covered. It enables probes used for testing and repairing such lines to obtain access to portions of such lines which would later be unavailable for contact.

Once each of the circuit lines 136 have been tested and, when appropriate, repaired, an insulating layer 154, shown in dotted lines in FIG. 13, is placed over the surface of the integrated circuit subassembly 130 and patterned to cover all of the circuit except for the contact pads 140 and the split pixels 138. The insulating layer 154 is formed from a deposited insulator such as silicon oxide ($Si_xO_y$) or silicon nitride ($Si_xN_y$). After the deposition of this layer the probe pads 142 are no longer available for further contact.

Figure 14:
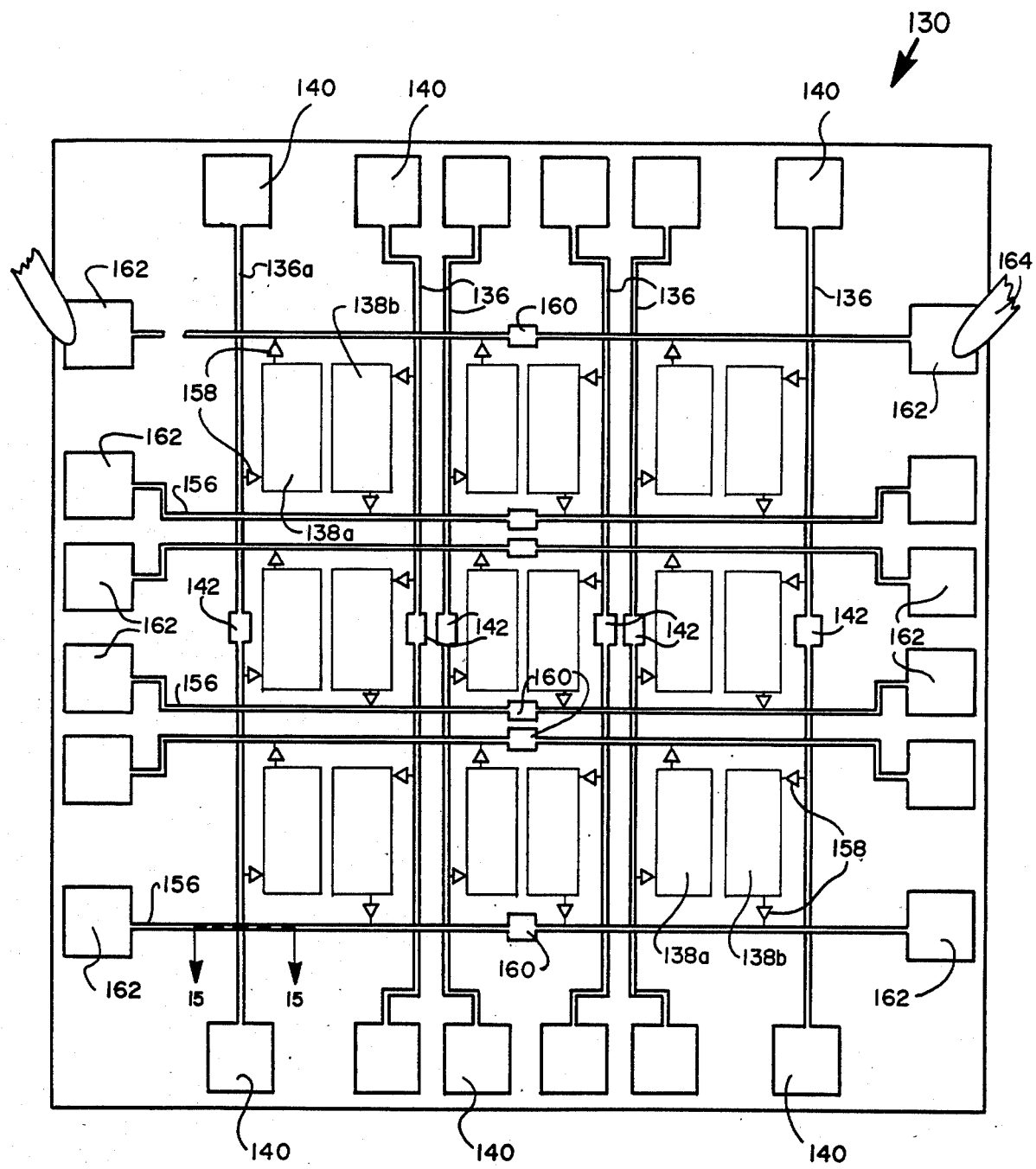
FIG. 14 is a top plan view of a completed integrated circuit designed for use in a liquid crystal display and of two electrical probes for use in repairing such a completed integrated circuit.
Figure 15:
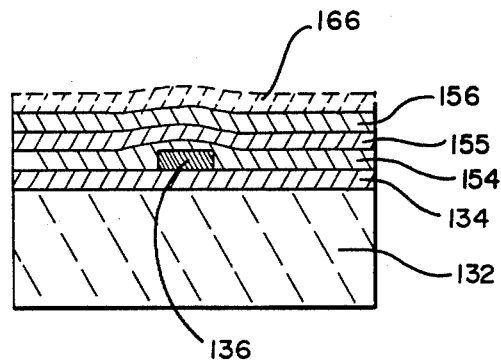
FIG. 15 is a cross-sectional sideview of a portion of the integrated circuit shown in FIG. 14 taken along the line 15—15 of that Figure.

Referring now to FIGS. 14 and 15, the integrated circuit 130 is shown after all its fabrication steps have been completed. In addition to the substrate 132, the phase-change material layer 134 and the ITO circuit lines 136, all shown in FIG. 13, the completed integrated circuit also contains the insulating layer 154, a further layer 155 of phase-change material, a further ITO layer containing the X address lines 156, and a passivation layer 166. Also deposited, but not shown in the cross-section of FIG. 15 are layers of N-type, I-type and P-type amorphous semiconductor materials used to fabricate the diodes 158 shown in FIG. 14. The diodes 158 are constructed in the manner shown and described in the above mentioned U.S. patent application Ser. No. 626,133.

The diodes 158 are connected so the electrode segments 138a and 138b of each split pixel 138 are each connected by at least one diode to one X line and one Y line. Thus each split pixel, which contains two electrode segments, is connected to two Y lines and two X lines. The diodes are oriented such that the electrode segments 138a can receive a positive voltage from their adjacent Y line 136 in one cycle of operation and receive a negative voltage from the X line 156 in another half cycle. The other electrode segment of a given pixel, segment 138b, is connected to receive the opposite polarity from its Y and X address lines in each half cycle. Thus during each half cycle a pixel to be excited has a voltage applied across its electrodes 138a and 138b. When the display of which the integrated circuit 130 is to be a part is later assembled, a separate substrate, not shown, is placed opposite the integrated circuit 130 and the gap between the circuit 130 and the opposing substrate is filled with liquid crystal material. The opposing substrate has a common electrode placed opposite each split pixel 138. The common electrode is allowed to electrically float, and the electrode segment 138a and one half of the common electrode form a first capacitance and the other half of the common electrodes and the electrode segment 138b form a second capacitance in series with the first. These two capacitive circuit elements operate together to form one pixel, or picture element. For a further description of liquid crystal displays using such split pixels, refer to the above mentioned U.S. patent application Ser. No. 626,133.

The ITO layer of which the lines 156 are formed is also caused to have probe pads 160 connected to the intermediate portions of each of the lines 156, as shown in FIG. 15. In addition, contact pads 162 are connected to the ends of each of the lines 156. During the fabrication of the integrated circuit 130, after the ITO layer has been deposited and patterned, but before subsequent layers have been deposited, probes 164, similar to the probes 148, 150 and 152 described above with regard to FIG. 12, are connected to the probe pads 160 and the contact pads 162. These probes test and repair the lines 156 in a manner similar to that described above with regard to FIG. 12, fusing the phase-change material in layer 155 to heal any line breaks detected. After each of the circuit lines 156 has been tested, and, when appropriate, repaired, metal is applied to the contact pads 162, and to the contact pads 140 and the entire circuit is covered with a passifying layer 166 made of an insulating material. This passifying layer 166 is etched away to leave the contact pads 140 and 162 and the electrode segments 138a and 138b of each of the split pixels uncovered, and the integrated circuit 130 is complete.

Even after the circuit 130 is completed, it is still possible to heal subsequent breaks which occur in the circuit. This can be done by applying the necessary voltage and currents between the contact pads 140 or 162 at each end of a given address line. In fact, it is possible to fabricate an integrated circuit such as 130 without the probe pads 142 or 160 shown in FIGS. 12 and 14, although the absence of such probe pads might make it more difficult to repair lines with multiple breaks. In such a case, there is no need to test or repair circuit lines until the integrated circuit is complete. At that time, probes are attached to the contact pads 140 or 162 at the end of a given line 136 or 156, respectively. If an electrical break is found in the line, sufficient voltage is applied to fuse the phase-change material bridging that break. In fact, even after the integrated circuit 130 is assembled with an opposing substrate, liquid crystal material and driving circuitry to form a complete display, it is still possible to repair breaks occurring in the address lines 136 and 156 by the proper application of voltages between the contact pads at the ends of such lines.

Figure 16:
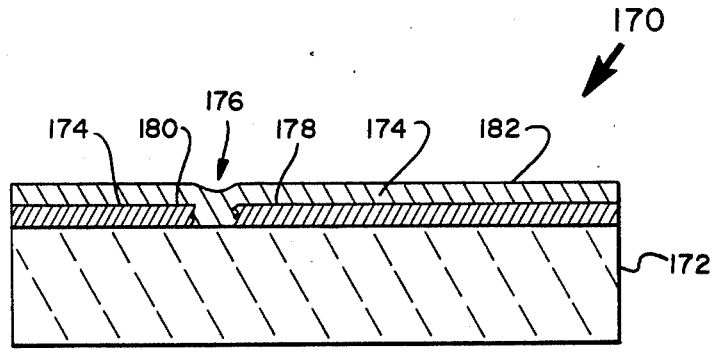
FIG. 16 is a cross-sectional side view of a portion of an electric circuit subassembly according to another aspect of the invention.
Figure 17:
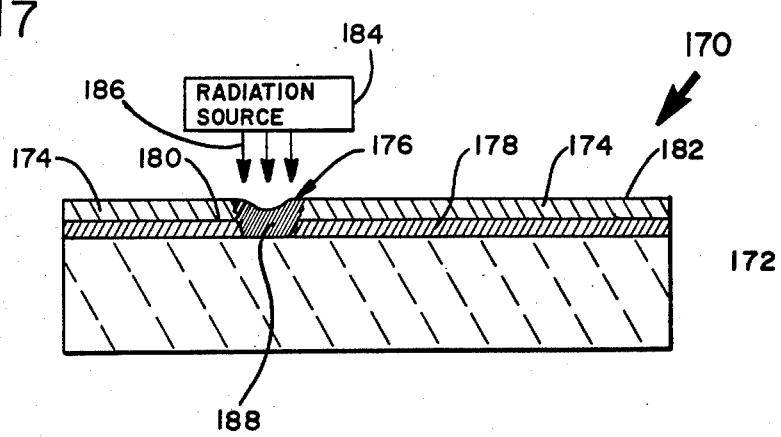
FIG. 17 is identical to FIG. 16, except it further includes a schematic representation of a radiation source, and a portion of its phase-change material which bridges a gap in its conductive line has been changed to a low resistance state by the radiation source.

Referring now to FIGS. 16 and 17, an alternative aspect of the present invention is shown. According to this aspect, a portion of an electric circuit, such as the portion 170 of an integrated circuit subassembly shown in FIGS. 16 and 17, is repaired by applying radiant energy to switch phase-change material which bridges a break in a circuit line to a more conductive state, rather than by applying a voltage and current, as described above. The portion 170 of an electric circuit comprises a substrate 172, made for example of glass, upon which a circuit line 174 has been deposited. The circuit line 174 is shown having an electrical break, or open circuit, 176 therein which separates it into two portions, a portion 178 and a portion 180. A layer 182 of phase-change material is deposited on top of the circuit line 174 so as to be in contact with that circuit line on both sides of the break 176 and so as to form a path parallel to the line 174 which bridges that open circuit.

When a break in a circuit line is detected, either by optical means or by electrical means similar to those described above, a radiation source 184 is positioned to project a beam of radiation 186 of sufficient intensity to convert the portion 188 of phase-change material located in gap 176 to its more conductive state, thus completing the circuit path of line 174 across the gap 176. For example, when the phase-change material 182 is formed of an amorphous layer of tellurium germanium chalcogenide approximately 2,000 angstroms thick, it is converted from a disordered amorphous state to a relatively crystalline state, such as a polycrystalline state, by being exposed to radiation in the form of a laser beam from an argon ion laser having an intensity of 2 nanojoules per square micron for a duration of over 200 nanoseconds. Similarly, when the amorphous material 182 is formed of a layer of amorphous silicon alloy approximately 2,500 to 5,000 angstroms thick, it is changed to a more conductive phase upon the application of approximately one joule per square centimeter for 50 nanoseconds or longer. Such exposure energies can be achieved by will 1.5 joule ruby laser.

All of the repairable circuits and methods for repairing circuits discussed above relate to integrated circuits. It should be understood, however, that the invention is not limited to integrated circuits and it applies generally to the repairing of any portion of an electric circuit of the type in which a conductive element and a portion of phase-change material capable of being changed from a relatively nonconductive state to a relatively conductive state contact each other along a given length.

Figure 18:
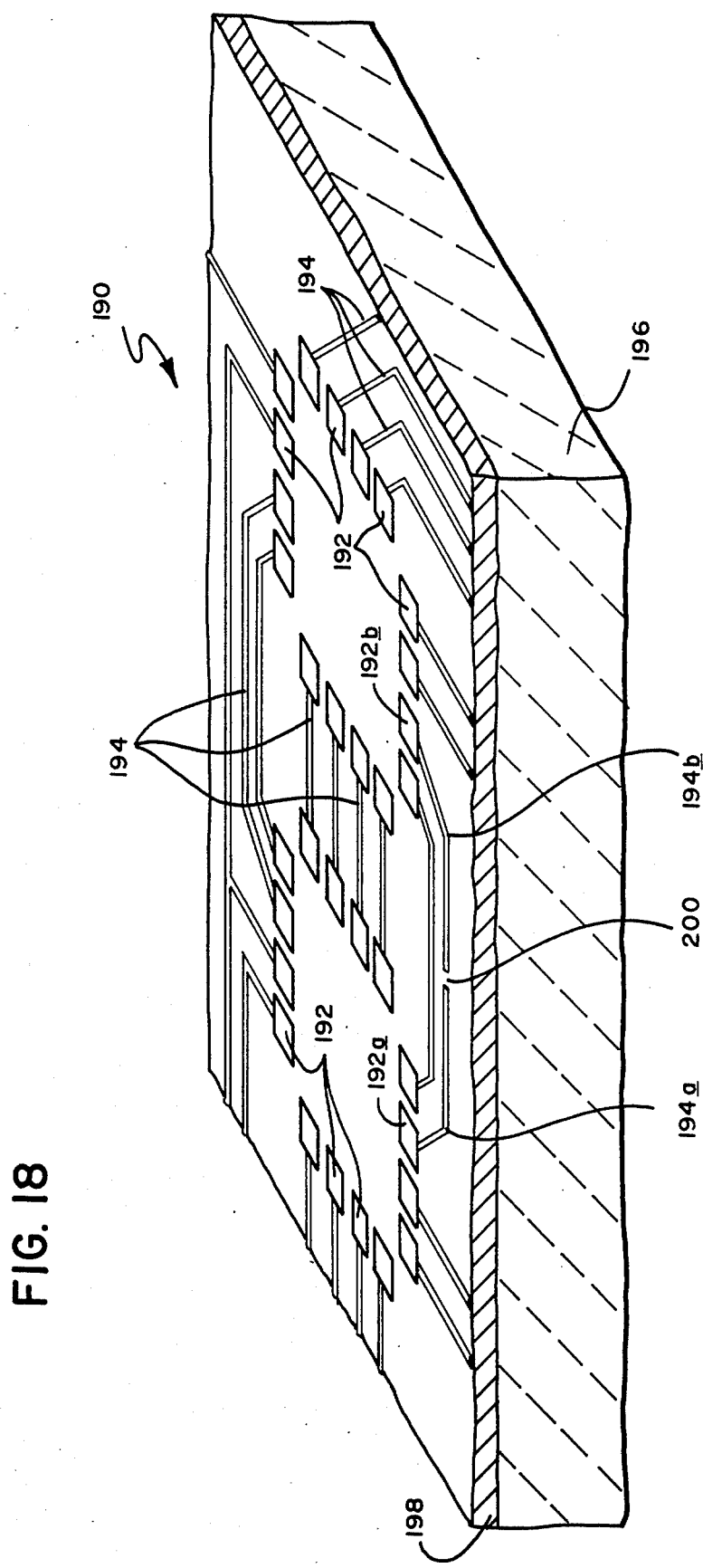
FIG. 18 is a perspective view of a portion of an interconnect substrate embodying the present invention.

For example, referring now to FIG. 18, an interconnect substrate 190 is shown which embodies the present invention. The substrate 190 is a ceramic interconnect substrate for connecting down-bonded integrated circuits. The substrate 190 contains a plurality of contact pads 192 positioned in rectangular groups so as to be individually soldered to, and to make electrical contact with, corresponding contact pads on down-bonded integrated circuits which are to be mounted over each group of the contact pads 192. The substrate 190 also includes a plurality of interconnecting lines 194, which are formed upon the substrate 190 by photolithographic means, or by other techniques such as silk screening. The lines 194 form electrical connections between contact pads of different integrated circuits which are to be mounted upon the substrate as well as connections between such integrated circuits and voltage input and output lines which are externally connected to the circuitry of the substrate 190. The substrate 190 is formed of a ceramic substrate 196 covered with a layer of phase-change material 198. The circuit lines 194 are formed over the layer 198 of phase-change material, so that the phase-change material forms a circuit path across any small breaks, such as the break 200 shown in FIG. 18, which form in the lines 194.

When such a break occurs, it can be healed in a manner similar to that described with regard to the circuits above by applying the proper voltage and current between the conductive lines on both sides of it. For example, with regard to the break 200 shown in FIG. 18, a voltage sufficient to cause a phase-change in the phase-change material 198 which bridges the gap 200 is applied by touching an electric probe to the contact pad 192a, which is connected to the line segment 194a formed on one side of the break 200, and by touching another electrical probe to the contact pad 192b connected to the line segment 194b on the other side of that break. By applying sufficient voltage between these electric probes, the phase-change material which bridges the gap 200 will be changed from its initially high resistance state to a low resistance state, so as to form an electrically shunting conductive path around the break 200, and thus to effectively heal that break.

Thus it can be seen that the present invention has applicability to more than just integrated circuits. It is applicable to ceramic interconnect substrates such as that shown in FIG. 18, and similarly it is applicable to other types of interconnect substrates, including printed circuit boards, multilayer interconnect substrates, polyimide interconnect substrates, and programmable interconnect substrates, as well as to many other sorts of circuitry.

Similarly, it should be understood that the phase-change material used according to the present invention need not be in the form of layers, but can be in any form which causes selected portions of selected conducting lines to be in contact with such phase-change material. Furthermore, it should be understood that the present invention is applicable to integrated circuits made with crystalline techology. For example, an integrated circuit fabricated on a crystalline substrate could have a layer of phase-change material placed over its conductive lines according to the present invention to enable open circuits occurring in such lines to be repaired. It is also to be understood that although the illustrations set forth above include memory devices and liquid crystal displays, the scope of the invention is not limited to such circuitry, but rather includes all manner of circuitry, including microprocessors, dedicated digital logic, and analog circuitry, in which it is desireable to to repair breaks occurring in circuit lines.

From the foregoing, it is apparent that integrated circuit subassemblies, completed integrated circuits, packaged integrated circuits and electrical circuitry in general can be made to be repairable and can be repaired by means of the present invention. It is recognized, of course, that those skilled in the art may make various modifications or additions to the preferred embodiments chosen to illustrate the invention without departing from the spirit and scope of the present contribution to the art.

I claim:

1. A method of making a circuit assembly comprising:
   providing a supporting substrate;
   forming a plurality of conductive lines supported on said substrate to interconnect circuit elements supported or to be supported on said substrate;
   forming a deposited phase-change material capable of being changed from an intially relatively disordered, relatively high resistance state to a more ordered, more crystalline relatively low resistance state by the application of sufficient energy, said deposited phase-change material being located in electrical contact with at least portions of said conductive lines to form electrically parallel paths between selected portions of said conductive lines;
   detecting at least one open circuit portion in one of said conductive lines within at least one of said selected portions; and applying sufficient energy to said phase-change material within said at least one selected portions of said conductive line having said detected open circuit portion to cause the inducement of a phase change within said phase-change material from said initially high resistance state to said low resistance state to form an electrically shunting conductive path around said detected open circuit portion of said one conductive line.

2. A method of making a circuit assembly as defined in claim 1, including the further step of forming contact receiving means positioned on said conductive lines to enable the application of said sufficient energy to said phase-change material.

3. A method of making a circuit assembly as defined in claim 1, wherein said forming of a deposited phase-change material includes depositing said phase-change material on said conductive lines.

4. A method of making a circuit assembly as defined in claim 1, wherein said forming of said conductive lines includes forming said conductive lines on said phase-change material.

5. A method of making a circuit assembly as defined in claim 1, wherein said phase-change material includes silicon.

6. A method of making a circuit assembly as defined in claim 1, wherein said phase-change material includes a chalcogenide element.

7. A method of making a circuit assembly as defined in claim 1, for use in a display of the type having at least one pixel each having circuit elements associated with said pixel, including a pair of electrodes with light influencing material disposed between said electrodes, wherein said forming of said conductive lines includes forming said conductive lines to connect to circuit elements associated with the individual pixels of such a liquid crystal display.

8. A method of making a circuit assembly as defined in claim 1 for use in an electronic matrix having a plurality of first spaced apart address lines, a plurality of second spaced apart address lines forming a plurality of cross over points with said first address lines, and selection means between each of said cross over points for establishing selectable current paths through respective pairs of said first and second address lines, wherein said forming of said conductive lines includes forming said conductive lines as address lines of said electronic matrix array.

9. A method of making a circuit assembly as defined in claim 8, wherein said forming of said phase-change material includes forming a layer of phase-change semiconductor material which forms part of said selection means between each of said cross over points.

10. A method as defined in claim 1, wherein said applying of said sufficient energy includes applying a sufficient voltage to said one conductive line and across said open circuit portion to cause sufficient current to flow through said phase-change material so as to switch that part of said phase-change material bridging said open circuit portion to said low resistance state.

11. A method as defined in claim 1, wherein said applying of said sufficient energy includes applying sufficient radiant energy to said phase-change material bridging said open circuit portion to switch that part to said low resistance state.

12. A method as defined in claim 11, wherein said applying of said radiant energy includes using a laser beam to apply said radiant energy.

13. A method of making a packaged circuit assembly comprising:
   (a) forming an integrated circuit which includes:
      providing a supporting substrate;
      forming a plurality of conductive lines supported on said substrate to interconnect circuit element supported on said substrate;
      forming a deposited phase-change material capable of electrically induced phase-change from an initially relatively disordered, relatively high resistance state to a more ordered, more crystalline, relatively low resistance state, said deposited phase-change material being located in electrical contact with at least portions of said conductive lines to form electrically parallel paths between selected portions of said conductive lines; and
   (b) forming packaging means enclosing said integrated circuit; and
   (c) forming connection means coupled to said conductive lines and extending from said integrated circuit, through said packaging means, and having a portion external to said packaging means, detecting open circuit portions within said conductive lines between said external portions of said connection means, and applying voltages to said external portions of said connection means associated with said detected open circuit line portions to thereby apply said voltages between selected portions of said conducitve lines and said phase-change material to permit the electrical inducement of a phase-change therein from said initially high resistance state to said low resistance state to from electrically shunting conductive paths around said detected open circuit portions of said conductive lines.

14. A method of making a packaged circuit assembly as defined in claim 13, wherein said forming of a deposited phase-change material includes depositing said phase-change material on said conductive lines.

15. A method of making a packaged circuit assembly as defined in claim 13, wherein said forming of said conductive lines includes forming said conductive lines on said phase-change material.

16. A method of making a packaged circuit assembly as defined in claim 13, wherein said phase-change material includes silicon.

17. A method of making a packaged circuit assembly as defined in claim 13, wherein said phase-change material includes a chalcogenide element.

18. A method of making a packaged circuit assembly as defined in claim 13 for use in a display of the type having at least one pixel each having circuit elements associated with said pixel, including a pair of electrode with light influencing material disposed between said electrodes, wherein said forming of said conductive lines includes forming said conductive lines to connect to circuit elements associated with the individual pixels of such a liquid crystal display.

19. A method of making a packaged circuit assembly as defined in claim 13 for use in an electronic matrix array having a plurality of first spaced apart address lines, a plurality of second spaced apart address lines forming a plurality of cross over points with said first address lines, and selection means between each of said cross over points for establishing selectable current paths through respective pairs of said first and second address lines, wherein said forming of said conductive lines includes forming said conductive lines as address lines of said electronic matrix array.

20. A method of making a packaged circuit assembly as defined in claim 19, wherein said forming of said phase-change material includes forming a layer of phase-change semiconductor material which forms part of said selection means between each of said cross over points.

* * * * *